United States Patent
Fink

(10) Patent No.: US 9,941,714 B2
(45) Date of Patent: Apr. 10, 2018

(54) BATTERY SYSTEM AND MOTOR VEHICLE WITH BATTERY SYSTEM

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignees: Robert Bosch GmbH, Stuttgart (DE); Samsung SDI Co., Ltd, Yongin-si, Gyeonggi-do (KR)

( * ) Notice: Subject to any disclaimer, the term of this patent is extended or adjusted under 35 U.S.C. 154(b) by 166 days.

(21) Appl. No.: 14/410,723

(22) PCT Filed: Jun. 18, 2013

(86) PCT No.: PCT/EP2013/062566
§ 371 (c)(1),
(2) Date: Dec. 23, 2014

(87) PCT Pub. No.: WO2014/001136
PCT Pub. Date: Jan. 3, 2014

(65) Prior Publication Data
US 2015/0326043 A1    Nov. 12, 2015

(30) Foreign Application Priority Data

Jun. 28, 2012   (DE) .................. 10 2012 211 088

(51) Int. Cl.
*H02J 7/00*   (2006.01)
*B60L 11/18*   (2006.01)
*G01R 19/165*   (2006.01)

(52) U.S. Cl.
CPC ......... *H02J 7/0026* (2013.01); *B60L 11/1803* (2013.01); *B60L 11/1809* (2013.01);
(Continued)

(58) Field of Classification Search
CPC .... H02J 7/0026; H02J 7/0029; H01M 10/482; H01M 10/4207; H01M 2/1016;
(Continued)

(56) References Cited

U.S. PATENT DOCUMENTS

| | | | | |
|---|---|---|---|---|
| 4,346,755 A | * | 8/1982 | Alley | F24F 11/0009 165/231 |
| 6,339,526 B1 | * | 1/2002 | Aboyoussef | H02H 3/24 327/527 |

(Continued)

FOREIGN PATENT DOCUMENTS

| | | |
|---|---|---|
| EP | 2 075 892 A2 | 1/2009 |
| EP | 2 337 182 A2 | 6/2011 |

OTHER PUBLICATIONS

International Search Report corresponding to PCT Application No. PCT/EP2013/062566, dated Nov. 6, 2013 and (German and English language document) (5 pages).

*Primary Examiner* — Drew A Dunn
*Assistant Examiner* — Sailesh Thapa
(74) *Attorney, Agent, or Firm* — Maginot, Moore & Beck LLP

(57) ABSTRACT

A battery system is described, comprising a battery management unit, a battery cell monitoring unit, at least one battery cell and a safety electronics system for the battery cell. The safety electronics system has a first comparator and an alarm signal output for an alarm signal. The first comparator compares a battery cell voltage of the battery cell to a predetermined threshold voltage value and generates the alarm signal on the basis of the comparison. The battery threshold voltage is lower than the battery cell voltage in normal operation and higher than a critical voltage value. In addition, a motor vehicle with the battery system is described, the battery system being connected to a drive system of the motor vehicle.

6 Claims, 2 Drawing Sheets

(52) U.S. Cl.
CPC ....... *B60L 11/1861* (2013.01); *B60L 11/1864* (2013.01); *H02J 7/0016* (2013.01); *H02J 7/0021* (2013.01); *B60L 2240/547* (2013.01); *B60L 2240/549* (2013.01); *B60L 2240/662* (2013.01); *B60L 2250/10* (2013.01); *G01R 19/16542* (2013.01); *H01M 2200/00* (2013.01); *H01M 2220/20* (2013.01); *Y02T 10/7011* (2013.01); *Y02T 10/7044* (2013.01); *Y02T 10/7055* (2013.01); *Y02T 10/7061* (2013.01); *Y02T 10/7291* (2013.01); *Y02T 90/16* (2013.01)

(58) Field of Classification Search
CPC ... H01M 10/425; G01R 31/3606; H02H 7/18; B25F 5/02
See application file for complete search history.

(56) References Cited

U.S. PATENT DOCUMENTS

| | | | | |
|---|---|---|---|---|
| 2012/0169292 A1* | 7/2012 | Cantin | .................. | H02J 7/0031 320/136 |
| 2013/0335095 A1* | 12/2013 | Kiuchi | .................. | H01M 10/48 324/426 |

* cited by examiner though the disclosure is not restricted thereto. By virtue of the battery system according to the disclosure, damage to the battery cell supervision unit caused by relatively high negative voltages is prevented in an advantageous manner.

BATTERY SYSTEM AND MOTOR VEHICLE WITH BATTERY SYSTEM

This application is a 35 U.S.C. § 371 National Stage Application of PCT/EP2013/062566, filed on Jun. 18, 2013, which claims the benefit of priority to Serial No. DE 10 2012 211 088.7, filed on Jun. 28, 2012 in Germany, the disclosures of which are incorporated herein by reference in their entirety.

The present disclosure relates to a battery system, which comprises a battery management unit, a battery cell supervision unit, at least one battery cell, and safety electronics for the battery cell. The safety electronics have a first comparator and an alarm signal output for an alarm signal. In addition, the disclosure relates to a motor vehicle comprising the battery system.

BACKGROUND

It is becoming apparent that, in the future, lithium-ion battery systems which are subject to very stringent requirements in respect of reliability, safety, performance and life, will be used both in stationary applications, for example in wind turbines, in vehicles, for example in hybrid and electric vehicles, and in laptops and mobile telephones.

The principle functional design of a battery system in accordance with the prior art is shown in FIG. 1. In order to achieve the required performance and energy data with such a battery system, individual battery cells 100 are usually connected to one another in series and sometimes additionally in parallel with a battery. A group of battery cells 100 is in this case connected in each case to one of a plurality of battery cell supervision units 102, also referred to as cell supervision circuit or CSC. A further functional unit is formed by the battery management system 104, to which the battery cell supervision units 102 are connected. In this case, the battery management system 104 ensures a high degree of safety, performance and life of the battery system. In addition to a battery state identification, said battery management system also includes diagnosis and safety functions and communications interfaces for other systems, for example thermal management of the battery.

A battery isolation unit 106, which is arranged between the battery cells 100 and terminals of the battery system, performs, inter alia, connection and disconnection of the battery to and from consumers. The battery isolation unit 106 is controlled by the battery management system 104 and safeguards the battery system with respect to impermissibly high currents and voltages and provides safety functions such as, for example, two-terminal disconnection of the battery cells 100 from the battery terminals, for example during maintenance work on the battery system. In conventional battery management systems, generally all-encompassing reserves or safety margins are nowadays included in the calculation for this in order to not pose a risk to the safety of the battery system which needs to be maintained with the greatest degree of priority for reasons of the provision of an excessively high performance.

The function of a conventional battery cell supervision unit 102 is shown in FIG. 2. The battery cell supervision unit 102 comprises, in a known manner, an analog-to-digital converter 200, which is connected to one of the battery cells 100 via a filter circuit 202. The analog-to-digital converter 200 digitizes a battery cell instantaneous voltage of the battery cell 100 and makes this available to evaluation electronics 204. The evaluation electronics 204 can then provide a control signal for a state-of-charge balancing circuit 206, also referred to as cell balancing, which is connected in parallel with the battery cell 100. In order to ensure safe operation of the battery cell 100, a comparator 208 is often also connected in parallel with said battery cell. Since it is known that conventional lithium-ion battery cells 100 have an operating voltage of typically 2.8 volts to 4.2 volts, the comparator 208 is configured such that it generates an alarm signal on an alarm signal bus 210 in the event of the lower or upper operating voltage being undershot or exceeded.

The measuring of the battery cell voltage, firstly by the battery cell supervision unit 102 and secondly by the comparator 208, therefore nowadays already ensures comparatively reliable supervision of battery cells 100.

SUMMARY

The disclosure provides a battery system which comprises a battery management unit, a battery cell supervision unit, at least one battery cell and safety electronics for the battery cell. The safety electronics have a first comparator and an alarm signal output for an alarm signal. The first comparator compares a battery cell voltage of the battery cell with a predetermined voltage threshold value and generates the alarm signal depending on the comparison. The voltage threshold value is in this case less than the battery cell voltage during normal operation and greater than a critical voltage value.

In addition, a motor vehicle comprising the battery system is provided, wherein the battery system is connected to a drive system of the motor vehicle.

The battery system according to the disclosure comprising safety electronics enables safe operation of a battery cell in an advantageous manner. The safety electronics do not in this case monitor the battery cell voltage, as is the case for known accompanying electronics, for example, during normal operation, but compare the battery cell voltage with the voltage threshold value, which is less than the battery cell voltage during normal operation. That is to say that the safety electronics substantially intervene in fault cases and generate an alarm signal when the battery cell voltage of the battery cell leaves the normal range and comes close to a critical voltage value, in particular a negative voltage.

If a fault case occurs in the battery system, for example because a consumer connected to the battery system has been short-circuited or because a battery cell itself has been damaged, battery cell fuses which are integrated in the battery cells for safety reasons generally operate. In this case, high negative voltages can occur at the battery cell supervision units, which are typically connected to the battery cells. If the battery cell fuse of a specific battery cell operates, the total voltage of the remaining battery cells can be present at this battery cell fuse and therefore at the respective battery cell supervision unit with a negative mathematical sign. The battery cell supervision unit may be damaged as a result of high negative voltages, for example catch fire or be burnt.

Owning to the operation of a battery cell fuse, the battery cell voltage of the affected battery cell is generally reduced. The first comparator preferably generates the alarm signal when the comparison shows that the battery cell voltage is less than the voltage threshold value. The comparator thus substantially detects the short circuit on the consumer side.

If, for example, a battery cell fuse of a battery cell operates, wherein the battery cell voltage of precisely this battery cell remains within a permissible range of typically approximately 2.8 V to approximately 4.2 V, the safety electronics identify that substantially no critical state is present, and the first comparator in this case in particular does not generate an alarm signal.

Although battery cell supervision units are also known which measure and process a battery cell voltage, the safety electronics of the battery system according to the disclosure form in particular a redundant, independent or additional measurement means with respect to the known battery cell supervision units which enables a high degree of safety classification for battery systems equipped with safety electronics. The safety electronics can advantageously enable classification of such a battery system, for example with an ASIL (Automotive Safety Integrity Level) C or D.

In accordance with a preferred exemplary embodiment, the battery system comprises accompanying electronics, which have a second comparator. The second comparator in particular monitors the battery cell voltage of the battery cell during normal operation. Normal operation is substantially a voltage range for the battery cell voltage which is between an end-of-charge voltage and an end-of-discharge voltage of the battery cell. Preferably, the battery cell is a lithium-ion battery cell. A lithium-ion battery cell generally has an end-of-charge voltage of approximately 4.2 V and an end-of-discharge voltage of approximately 2.8 V or 2.5 V. At very low ambient temperatures of, for example, −30° C., the end-of-discharge voltage can also be lower, for example at 2.1 V.

The accompanying electronics can be connected to each battery cell and substantially check, by means of the second comparator, whether the battery cell voltage exceeds the end-of-charge voltage or undershoots the end-of-discharge voltage. Depending on these checks, the accompanying electronics can generate a further alarm signal. Preferably, the safety electronics supplement the accompanying electronics and the battery cell supervision unit in order to increase the operational safety of the battery system.

Accompanying electronics and battery cell supervision units generally have a low input resistance and therefore are easily damaged in the case of high negative input voltages. A voltage lower limit of the accompanying electronics or the battery cell supervision unit which is specified in a data sheet, for example, preferably forms the critical voltage value. The first comparator is preferably configured such that it generates the alarm signal before the battery cell voltage reaches the critical voltage value, with the result that the accompanying electronics and the battery cell supervision unit can be protected from damage in the event of a fault.

If the first comparator has an input resistance of preferably several kiloohms or megaohms, the first comparator is particularly robust with respect to a high applied voltage.

In addition, it is advantageous when the battery system is provided with a battery isolation unit, which isolates the battery system from a consumer depending on the alarm signal. A consumer generally comprises electric motors, pulse-controlled inverters, inverters or the like. If, in the event of a fault, a short circuit occurs in the consumer, for example, and this is identified by the first comparator of the safety electronics, the alarm signal can actuate the battery isolation unit such that the battery system is isolated from the consumer in particular at two terminals. In order to be able to ensure a high degree of operational safety and failsafety of the battery system, a separate hardware line which transmits the alarm signal from the safety electronics to the battery cell supervision unit or to the battery management unit is preferred.

In a preferred development, the battery system according to the disclosure can comprise a short-circuiting path, which connects the battery cell monitoring unit in parallel with the battery cell depending on the alarm signal. The short-circuiting path short-circuits the respective battery cell and thus prevents, for example, the occurrence of high negative voltages in the battery system.

BRIEF DESCRIPTION OF THE DRAWINGS

Exemplary embodiments of the disclosure will be explained in more detail with reference to the drawings and the description below. In the drawings.

DETAILED DESCRIPTION

Figure 3:
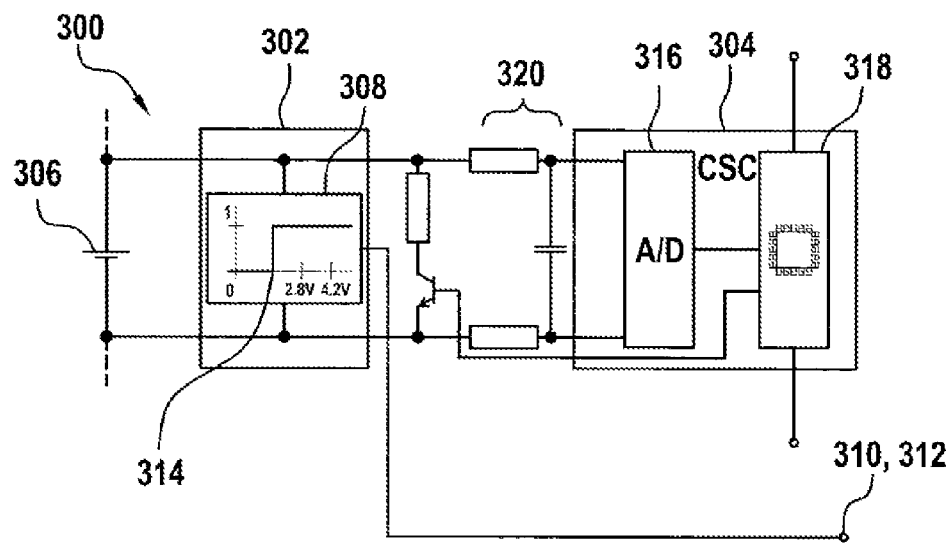
FIG. 3 shows a battery system in accordance with an exemplary embodiment of the disclosure.

FIG. 3 shows a battery system 300 comprising safety electronics 302 and a battery cell supervision unit 304 for a battery cell 306. The safety electronics 302 comprise a first comparator 308 and an alarm signal output 310 for an alarm signal 312. The first comparator 308 compares a predetermined voltage threshold value $U_{threshold}$ 314 with a battery cell voltage $U_{cell}$ present at the battery cell 306. Depending on the comparison, the comparator generates the alarm signal 312.

The battery cell supervision unit 304 is used for supervision of the battery cell 306. For this purpose, the battery cell supervision unit 304 comprises an analog-to-digital converter 316 and evaluation electronics 318. The analog-to-digital converter 316 has inputs, which are connected to the battery cells 306 and tap off the battery cell voltage $U_{cell}$ there. In order to adhere to the Nyquist sampling theorem, a low-pass filter 320 is connected upstream of each of the analog-to-digital converter inputs. In order not to impair the measurement accuracy of the analog-to-digital converter as a result of any voltage drop or the like, input resistances of the analog-to-digital converter and resistances in the low-pass filter 320 are chosen to have a low value.

Figure 1:
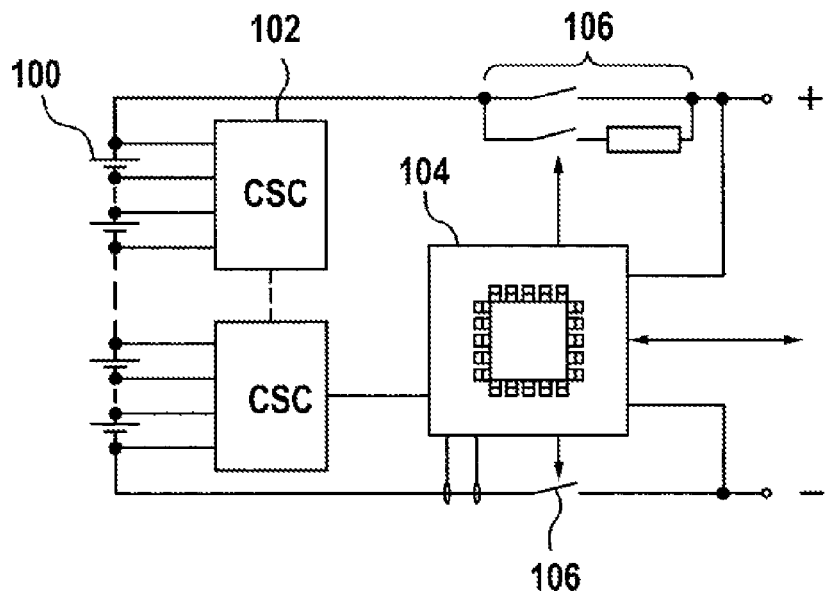
FIG. 1 shows a battery system from the prior art.
Figure 2:
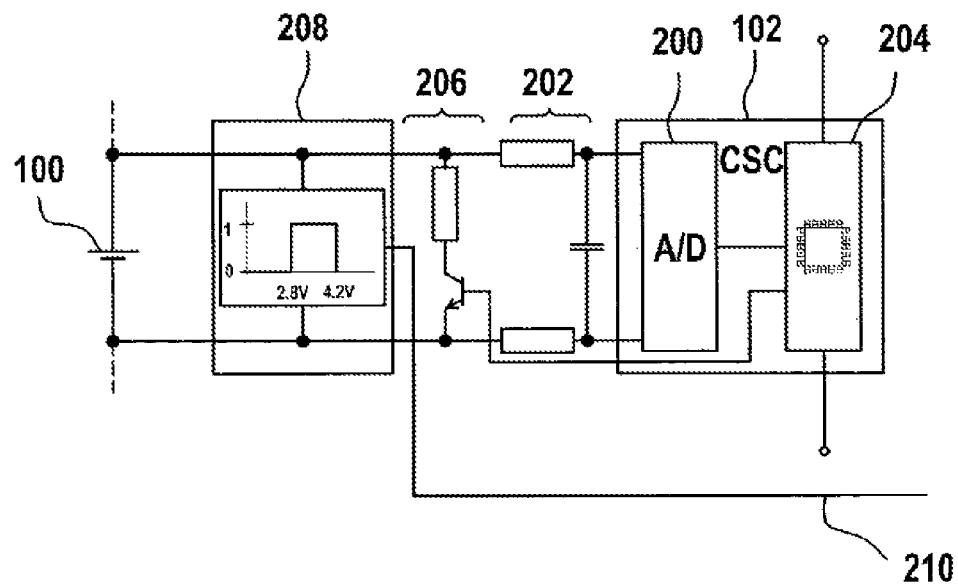
FIG. 2 shows a battery cell supervision unit from the prior art.

In addition, accompanying electronics 208 can also be connected in parallel with the battery cell 306, as is known from FIG. 2.

During normal operation, the battery cell voltage $U_{cell}$ is between an end-of-discharge voltage $U_{discharged}$ of approximately 2.8 V and an end-of-charge voltage $U_{charged}$ of approximately 4.2 V.

The battery cell supervision unit 304 and the accompanying electronics 208 are each specified in the data sheet with a voltage lower limit, which forms a critical voltage $U_{crit}$, of minus five volts, for example, in the present exemplary embodiment. Below this, said battery cell supervision unit and said accompanying electronics would be damaged.

The voltage threshold value $U_{threshold}$ can therefore be fixed in advance as follows:

$$U_{crit} < U_{threshold} < U_{discharged}$$

Figure 4:
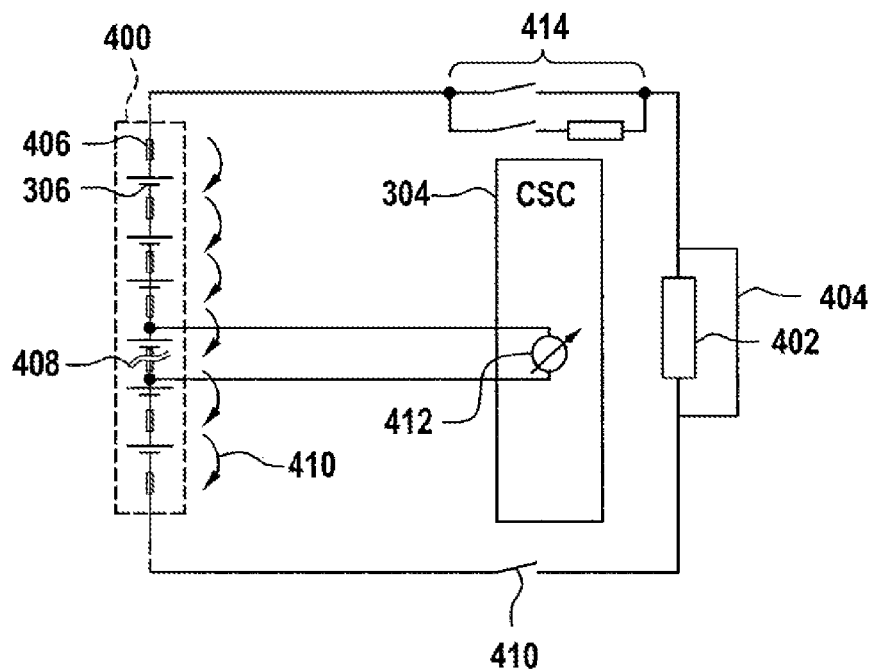
FIG. 4 shows a battery system in accordance with a further exemplary embodiment of the disclosure.

FIG. 4 shows the battery system 300 in the event of a fault. Several of the battery cells 306 form a battery 400, which is connected to a consumer 402, in FIG. 4. The consumer 402 is defective, for example, owing to a short circuit 404 illustrated schematically in FIG. 4. The consumer 402 generally denotes an inverter, a pulse-controlled inverter, a generator and/or an electric motor.

The battery cells 306 comprise battery cell fuses 406 for such a fault case. One of the battery cell fuses 406 operates at the point 408, i.e. it isolates the circuit of the battery system 300 at this point 408.

The battery cell supervision unit 304 also monitors the battery cell voltages $U_{cell}$, which are indicated by arrows 410 in FIG. 4, during this fault event. The analog-to-digital converter 316 and the low-pass filter 320 together form a voltage measurement unit 412. Since the circuit of the battery system 300 in the present exemplary embodiment comprises a series circuit of a number of n battery cells 306, in the damage case shown a damaging voltage of $U_{damage}$ is present at the voltage measurement unit 412, for example.

$$U_{damage} = -(n-1) \cdot U_{cell}$$

Owing to the short circuit 404, a high negative damaging voltage is produced at the voltage measurement unit 412, which would result in damage to said voltage measurement unit. Any accompanying electronics 208 connected to the battery cell 306 would also be damaged.

The first comparator 308, which is connected to the battery cell 306, does, however, compare the battery cell voltage $U_{cell}(t)$ continuously with the voltage threshold value $U_{threshold}$ and generates the alarm signal 312 when the battery cell voltage $U_{cell}(t)$ undershoots the voltage threshold value $U_{threshold}$.

$$U_{cell}(t) < U_{threshold}$$

The alarm signal 312 is made available to the battery cell monitoring unit 304 and a battery management unit. The battery management unit for its part controls a battery isolation unit 414, which isolates the consumer 402, and thus the short circuit 404, from the battery system 300 or from the battery 400 at two terminals. Thus, there are no high negative voltages present at the battery cell supervision unit 304 and the accompanying electronics 208.

The alarm signal 312 can also directly control the battery isolation unit 410. By virtue of this exemplary embodiment, the safety electronics 302 become independent of any software, and the isolation of the battery system 300 from the consumer 402 takes place more quickly.

The described battery system can in particular increase the failsafety and operational safety of motor vehicles equipped with the battery system.

The invention claimed is:

1. A battery system comprising:
   a battery management unit;
   at least one battery cell;
   a battery cell supervision unit configured to monitor the at least one battery cell;
   a first comparator configured to compare a battery cell voltage of the at least one battery cell with a permissible operating range defined between a minimum permissible operating voltage of the at least one battery cell and a maximum permissible operating voltage of the at least one battery cell, the first comparator being configured output a first alarm signal in response the battery cell voltage being outside the permissible operating range;
   a second comparator configured to compare the battery cell voltage of battery cell voltage of the at least one battery cell with a predetermined voltage threshold value, the second comparator being configured to output a second alarm signal in response to the battery cell voltage being less than the predetermined voltage threshold value, the predetermined voltage threshold value being less than the minimum permissible operating voltage of the at least one battery cell and greater than a specified voltage lower limit of one of (i) the first comparator and (ii) the battery cell supervision unit; and
   a battery isolation unit configured to disconnect the at least one battery cell from a consumer in response the second alarm signal.

2. The battery system as claimed in claim 1, wherein the second comparator has an input resistance of several kilo-ohms or megaohms.

3. The battery system as claimed in claim 1, further comprising:
   a separate hardware line configured to transmit the second alarm signal from the second comparator to one of the battery cell supervision unit and the battery management unit.

4. The battery system as claimed in claim 1, further comprising:
   a short-circuiting path configured to connect the battery cell monitoring unit in parallel with the at least one battery cell in response to the second alarm signal.

5. The battery system as claimed in claim 1, wherein the at least one battery cell is a lithium-ion battery cell.

6. A motor vehicle comprising:
   a drive system; and
   a battery system connected to the drive system, the battery system comprising:
     a battery management unit;
     at least one battery cell;
     a battery cell supervision unit configured to monitor the at least one battery cell;
     a first comparator configured to compare a battery cell voltage of the at least one battery cell with a permissible operating range defined between a minimum permissible operating voltage of the at least one battery cell and a maximum permissible operating voltage of the at least one battery cell, the first comparator being configured output a first alarm signal in response the battery cell voltage being outside the permissible operating range; and
     a second comparator configured to compare the battery cell voltage of battery cell voltage of the at least one battery cell with a predetermined voltage threshold value, the second comparator being configured to output a second alarm signal in response to the battery cell voltage being less than the predetermined voltage threshold value, the predetermined voltage threshold value being less than the minimum permissible operating voltage of the at least one battery cell and greater than a specified voltage lower limit of one of (i) the first comparator and (ii) the battery cell supervision unit; and
     a battery isolation unit configured to disconnect the battery system from the drive system in response the second alarm signal.

* * * * *